United States Patent
Tominaga et al.

(10) Patent No.: US 7,099,131 B2
(45) Date of Patent: Aug. 29, 2006

(54) SURGE ABSORBER AND SURGE ABSORBER ARRAY

(75) Inventors: Toru Tominaga, Yokaichi (JP); Makoto Matsubara, Takefu (JP); Yukichi Sakurai, Sabae (JP); Takaaki Ooi, Takefu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 253 days.

(21) Appl. No.: 10/706,071

(22) Filed: Nov. 13, 2003

(65) Prior Publication Data

US 2004/0125530 A1    Jul. 1, 2004

(30) Foreign Application Priority Data

Dec. 27, 2002   (JP) .............................. 2002-381636

(51) Int. Cl.
*H02H 9/00* (2006.01)
(52) U.S. Cl. .................. 361/56; 361/111; 361/257; 361/536; 361/119; 338/20; 338/21; 257/701; 257/702; 257/703
(58) Field of Classification Search ................. 361/56, 361/111, 119; 328/20, 21; 257/536
See application file for complete search history.

(56) References Cited

U.S. PATENT DOCUMENTS

| 5,075,665 A | * | 12/1991 | Taira et al. .................... 338/21 |
| 5,324,986 A | * | 6/1994 | Ueno et al. ................... 257/701 |
| 5,386,335 A | * | 1/1995 | Amano et al. ................. 361/56 |
| 5,412,357 A | * | 5/1995 | Nakamura et al. ........... 333/181 |

FOREIGN PATENT DOCUMENTS

| JP | 63-45749 | 11/1988 |
| JP | 1-102884 | 4/1989 |
| JP | 2932768 | 5/1999 |

* cited by examiner

Primary Examiner—Brian Sircus
Assistant Examiner—Terrence Willoughby
(74) Attorney, Agent, or Firm—Keating & Bennett, LLP

(57) ABSTRACT

A surge absorber includes a laminated compact of a first ceramic green sheet having a first internal electrode film extending to both sides thereof, a second ceramic green sheet having an second internal electrode film extending to both end surfaces thereof, and a third ceramic green sheet having a discharge hole. Ground external electrode layers are provided on both sides of the laminate so as to be connected with both ends of the first internal electrode film, and signal external electrode layers are further provided on both end surfaces of the laminated compact so as to be connected with both ends of the second internal electrode film. The laminated compact may also include a resistance element.

14 Claims, 21 Drawing Sheets

SURGE ABSORBER AND SURGE ABSORBER ARRAY

BACKGROUND OF THE INVENTION

1. Field of the Invention

The present invention relates to a surge absorber and a surge absorber array, and more particularly to a surge absorber and a surge absorber array for absorbing and removing a surge voltage which enters a signal line.

2. Description of the Related Art

Generally, electronic components, such as ICs, which are susceptible to an incoming surge voltage include a surge absorber using a discharge element. Such a surge absorber is typically mounted between a signal line and a ground on a printed board.

As disclosed in Japanese Examined Utility Model Registration Application Publication No. 63-45749 and Japanese Unexamined Patent Application Publication No. 1-102884, a two-terminal surge absorber in which a laminated compact of ceramic sheets includes a pair of internal electrodes and a discharge hole is known in the related art.

When such a two-terminal surge absorber is mounted on a printed board, the ground wiring on the printed board gets complicated and a large mounting space is required. So miniaturization of devices is difficult to achieve.

This type of surge absorber uses a combination of a discharge element and a resistance element. When a discharge element is used alone, it is generally difficult to obtain a discharge element having a low discharge-starting voltage, because the discharge must start at a voltage below the breakdown voltage of the IC in order to protect the IC.

In the related art, the discharge element and the resistance element are configured as separate components, however, and it takes substantial time and labor to mount the components on a printed board, which increases the manufacturing cost and the required space for mounting.

Japanese Unexamined Patent Application Publication No. 5-6810 discloses a chip varistor with a resistor. However, a varistor generally has a capacitance of several picofarads to several hundred picofarads due to its material and structure, so it cannot be used in a high-speed signal processing circuit because the signal wave is rounded.

SUMMARY OF THE INVENTION

To overcome the problems described above, preferred embodiments of the present invention provide a surge absorber and a surge absorber array that requires a small space for mounting on a printed board so as to reduce the size of devices.

Preferred embodiments of the present invention also provide a surge absorber and a surge absorber array having a low capacitance so as to be suitable for a high-speed signal processing circuit.

In a first preferred embodiment of the present invention, a surge absorber includes an insulator block having a first internal electrode film, a second internal electrode film, and a discharge hole located in proximity to the first and second internal electrode films, a ground external electrode layer provided on a side surface of the insulator block so as to be connected with an end of the first internal electrode film, and signal external electrode layers provided on both end surfaces of the insulator block so as to be connected with both ends of the second internal electrode film.

In a second preferred embodiment of the present invention, a surge absorber includes a laminated compact of a first insulator sheet having a first internal electrode film, a second insulator sheet having a second internal electrode film, and a third insulator sheet between the first and second insulator sheets having a discharge hole, a ground external electrode layer provided on a side surface of the laminate compact so as to be connected with an end of the first internal electrode film, and signal external electrode layers provided on both end surfaces of the laminated compact so as to be connected with both ends of the second internal electrode film.

In a third preferred embodiment of the present invention, a surge absorber includes a laminated compact of a first insulator sheet having a second internal electrode film and first internal electrode films on both sides of the second internal electrode film, and a second insulator sheet having a discharge hole located in proximity to the first internal electrode films and the second internal electrode film, a ground external electrode layer provided on each of both side surfaces of the laminate so as to be connected with one end of each of the first internal electrode films, and signal external electrode layers provided on both end surfaces of the laminate so as to be connected with both ends of the second internal electrode film.

The surge absorber according to the first to third preferred embodiments of the present invention preferably has a three-terminal structure, in which a pair of signal external electrode layers is provided on both end surfaces of the insulator block or the laminated compact, and a ground external electrode layer is provided on a side surface of the insulator block or the laminated compact so as to be arranged between the pair of signal external electrode layers. In the structure of the surge absorber according to preferred embodiments of the present invention, a ground line extends across signal lines on a printed board. Therefore, the wiring of the ground line is simple enough to enable the surge absorber to be mounted in a small space.

In the surge absorber according to the first to third preferred embodiments of the present invention, a resistor film connected between one end of the second internal electrode film and one of the signal external electrode layers is preferably provided on at least one end surface of the insulator block or the laminated compact. Thus, a surge absorber where a discharge element and a resistance element are integrated is obtained, and the complication of separate attachment of resistance elements and deterioration in the mounting density of components on a printed board is eliminated. Moreover, because of its low capacitance, the surge absorber is suitable for a high-speed signal processing circuit.

In a fourth preferred embodiment of the present invention, a surge absorber array includes an insulator block having a first internal electrode film, a plurality of second internal electrode films, and at least one discharge hole located in proximity to the first internal electrode film and the second internal electrode films, a ground external electrode layer provided on an end surface of the insulator block so as to be connected with an end of the first internal electrode film, and signal external electrode layers provided on both side surfaces of the insulator block so as to be independently connected with both ends of each of the second internal electrode films.

In a fifth preferred embodiment of the present invention, a surge absorber array includes a laminated compact of the first insulator sheet having a first internal electrode film, a second insulator sheet having a plurality of a second internal electrode films, and a third insulator sheet between the first and second insulator sheets having at least one discharge hole, a ground external electrode layer provided on an end surface of the laminated compact so as to be connected with one end of the first internal electrode film, and signal external electrode layers provided on both side surfaces of the laminated compact so as to be independently connected with both ends of each of the second internal electrode films.

The surge absorber array according to the fourth and fifth preferred embodiments of the present invention also has a three-terminal structure. Therefore, the wiring of a ground line on a printed board is simple enough for the surge absorber array to be mounted in a small space.

In a sixth preferred embodiment of the present invention, a surge absorber includes a laminated compact of a first insulator sheet having a first internal electrode film, a second insulator sheet having a second internal electrode film, and a third insulator sheet between the first and second insulator sheets having a discharge hole, a resistor film provided on a surface of the laminated compact, a ground external electrode layer provided on a side surface of the laminated compact so as to be connected with one end of the first internal electrode film, a signal external electrode layer provided on one end surface of the laminated compact so as to be connected with an end of the second internal electrode film and one end of the resistor film, and another signal external electrode layer provided on the other end surface of the laminated compact so as to be connected with the other end of the resistor film.

The surge absorber according to the sixth preferred embodiment of the present invention also has a three-terminal structure. Therefore, the wiring of a ground line on a printed board is simple enough for the surge absorber to be mounted in a small space. In addition, a surge absorber with a discharge element and a resistance element that are integrated is obtained, such that complications in separate attachment of resistance elements and deterioration in the mounting density of components on a printed board is eliminated. Moreover, because of its low capacitance, the surge absorber is suitable for high-speed signal processing circuit.

In the surge absorber according to the sixth preferred embodiment, the resistor film is preferably asymmetrical in plane view relative to the direction of a line extended between both side surfaces of the laminated compact. The asymmetrical resistor film provided on the surface of the laminate allows the direction in which the surge absorber is mounted to be readily identified.

In a seventh preferred embodiment of the present invention, a surge absorber includes a laminated compact of a first insulator sheet having a first internal electrode and a second insulator sheet having a second internal electrode film, a third insulator sheet between the first and second insulator sheets having a discharge hole, and a fourth insulator sheet having a resistor film, a ground external electrode layer provided on a side surface of the laminated compact so as to be connected with one end of the first internal electrode film, a signal external electrode layer provided on one end surface of the laminated compact so as to be connected with an end of the second internal electrode film and one end of the resistor film, and another signal external electrode layer provided on the other end surface of the laminated compact so as to be connected with the other end of the resistor film.

Since the surge absorber according to the seventh preferred embodiment is configured such that the resistor film is incorporated in the laminated compact of the surge absorber of the sixth preferred embodiment, the surge absorber achieves advantages that are similar to those in the sixth preferred embodiment.

The above and other elements, characteristics, features, and advantages of the present invention will become clear from the following description of preferred embodiments taken in conjunction with the accompanying drawings.

DETAILED DESCRIPTION OF PREFERRED EMBODIMENTS

Preferred embodiments of a surge absorber and a surge absorber array according to the present invention are described with reference to the drawings.

First Preferred Embodiment

Figure 1:
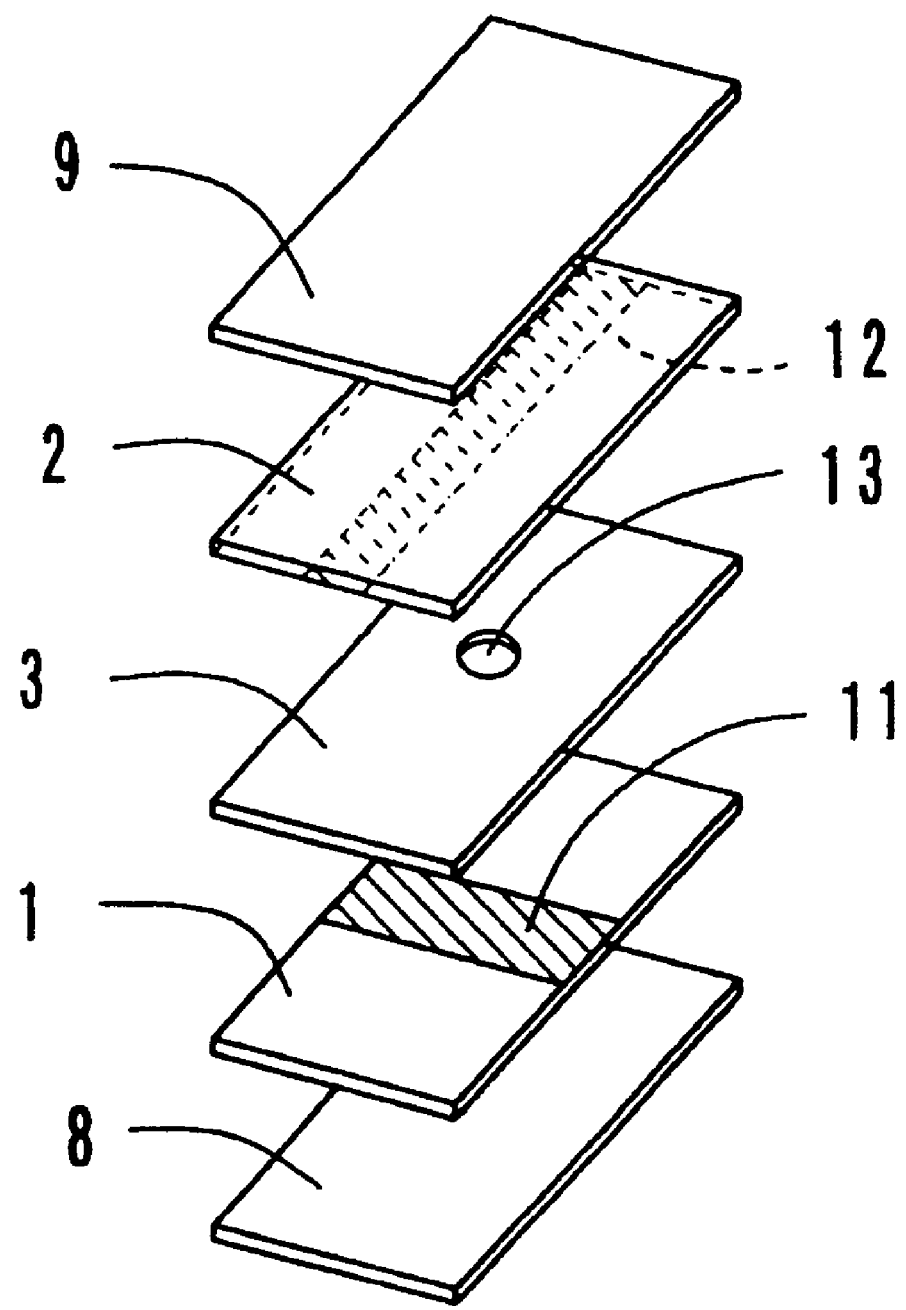
FIG. 1 is an exploded perspective view of sheets defining a laminated compact of a surge absorber according to the first preferred embodiment of the present invention.

FIGS. 1 through 6 show a laminate-type chip surge absorber according to the first preferred embodiment of the present invention. As shown in FIG. 1, the first internal electrode film 11 is formed on the obverse surface of a ceramic green sheet 1 so as to extend to both side surfaces thereof by screen printing, and the second internal electrode film 12 is formed on the reverse surface of a ceramic green sheet 2 so as to extend to both end surfaces thereof by screen printing. A ceramic green sheet 3 having a discharge hole 13 provided therein is sandwiched between the ceramic green sheets 1 and 2. The ceramic green sheets 1 to 3 and external plain ceramic green sheets 8 and 9 are provided in a laminated compact 10A shown in FIG. 2.

Any technique other than screen printing, such as gravure printing, dry plating, or photolithography may be used to form the first and second internal electrode films 11 and 12.

Figure 2:
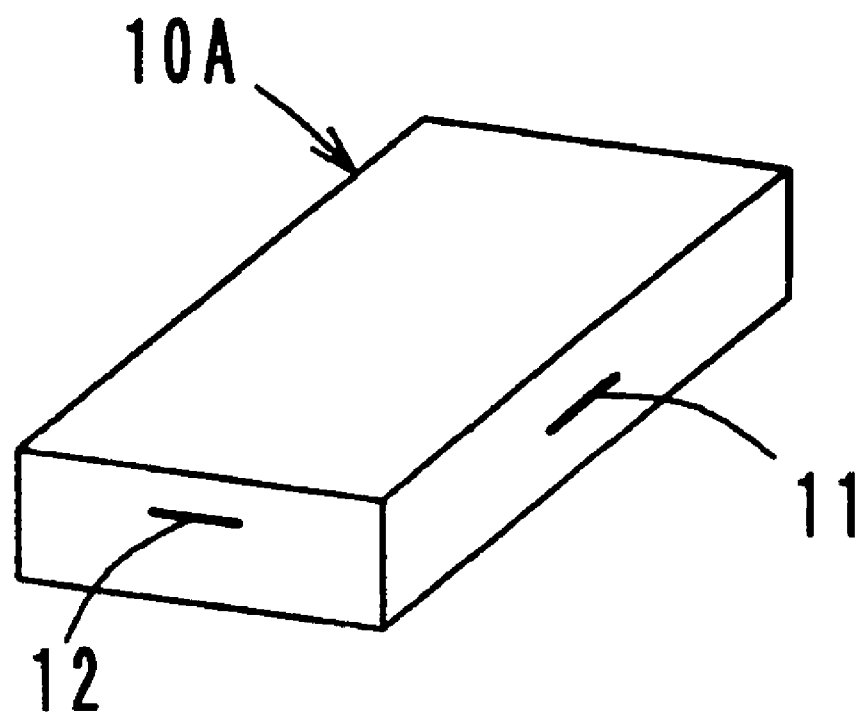
FIG. 2 is a perspective view of a laminated compact of the sheets shown in FIG. 1.
Figure 3:
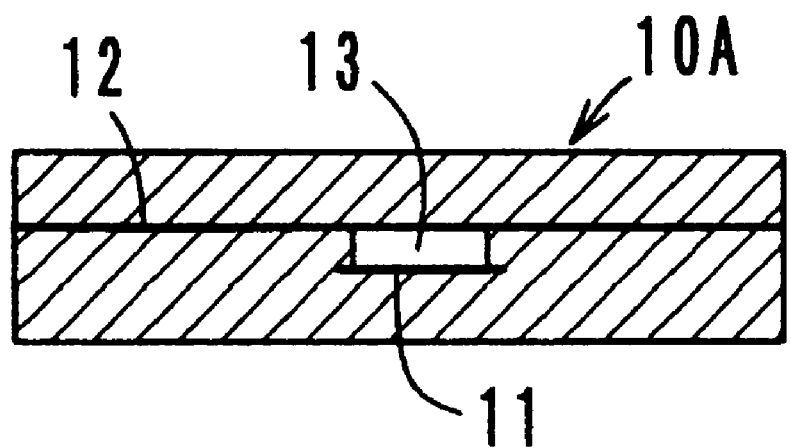
FIG. 3 is a cross-sectional view of the laminated compact of the sheets shown in FIG. 1.

The sheets 1 through 3, 8, and 9 are laminated and compressed by a known method, and are baked to thereby form the one-unit laminated compact 10A shown in FIG. 2. FIG. 3 shows the cross-section of the laminated compact 10A.

The sheet 2 having the second internal electrode film 12 provided on the reverse surface thereof may be provided by reversing a sheet having an electrode film provided thereon in the same manner as the sheet 1, or the second internal electrode film 12 may be provided in advance on the reverse surface of the sheet 2.

Figure 4:
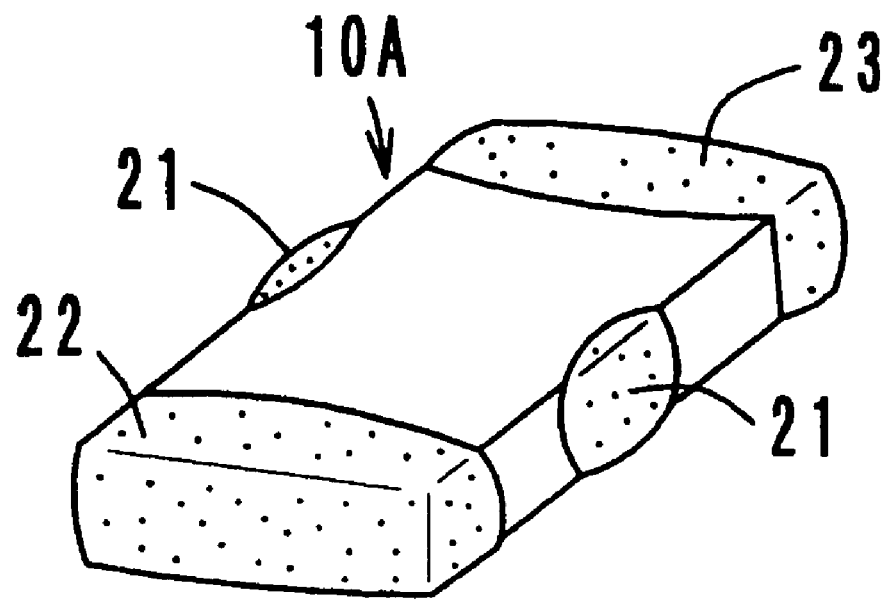
FIG. 4 is a perspective view of external electrode layers provided on the laminated compact shown in FIG. 2.

As shown in FIG. 4, ground external electrode layers 21 are provided on both of the side surfaces of the laminated compact 10A so as to be connected with both ends of the first internal electrode film 11, and signal external electrodes, that is, an input external electrode layer 22 and an output external electrode layer 23, are provided on both end surfaces of the laminated compact 10A so as to be connected with both ends of the second internal electrode film 12. The external electrode layers 21, 22, and 23 are formed by an appropriate method, such as wet or dry plating, immersion, or coating, and are then baked, if necessary. The laminate 10A and the external electrode layers 21, 22, and 23 may be baked at the same time.

Figure 5:
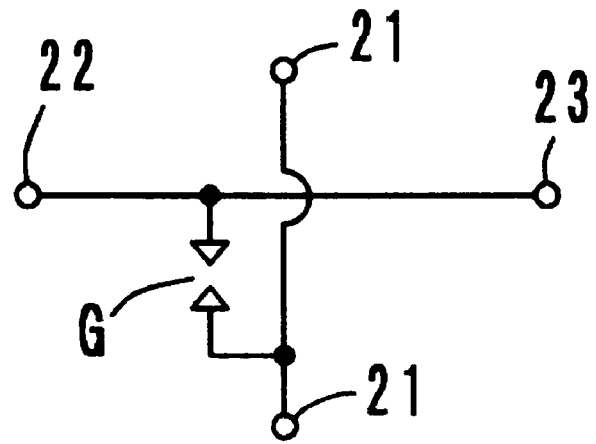
FIG. 5 is an equivalent circuit diagram of the surge absorber according to the first preferred embodiment of the present invention.

A discharge element G is generated by the internal electrode films 11 and 12 facing each other in the lamination direction with the hole 13 therebetween, thus defining a three-terminal laminated surge absorber having an equivalent circuit that is shown in FIG. 5.

Figure 6:
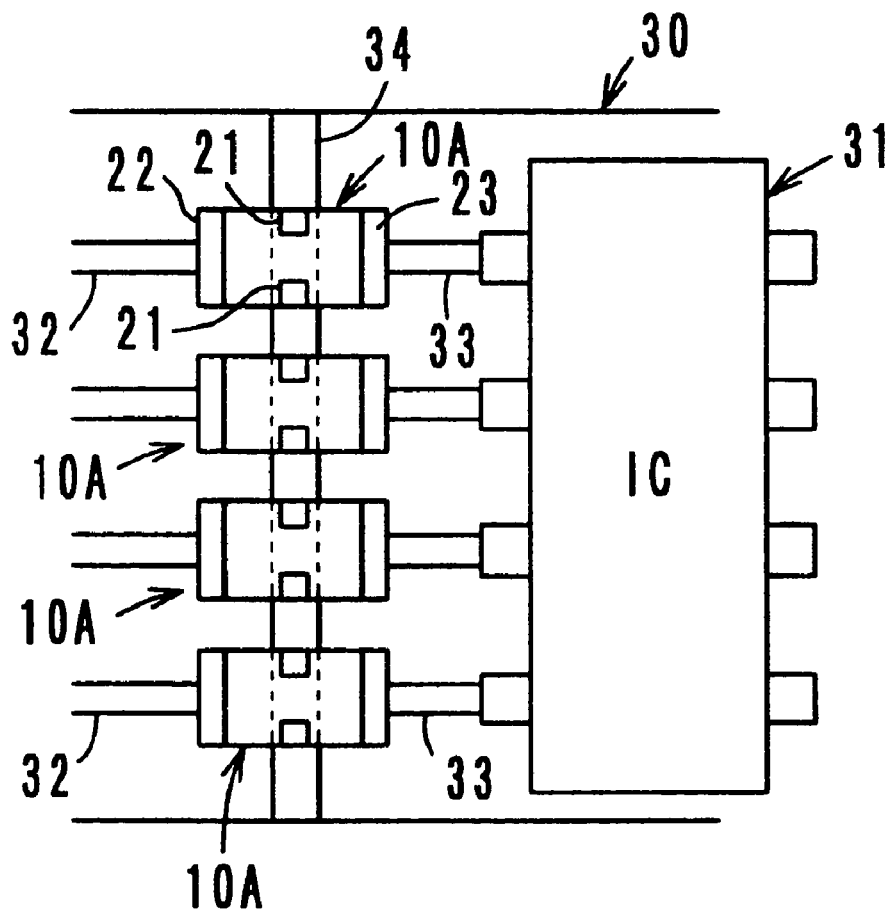
FIG. 6 is a plan view of surge absorbers according to the first preferred embodiment mounted on a printed board.
Figure 7:
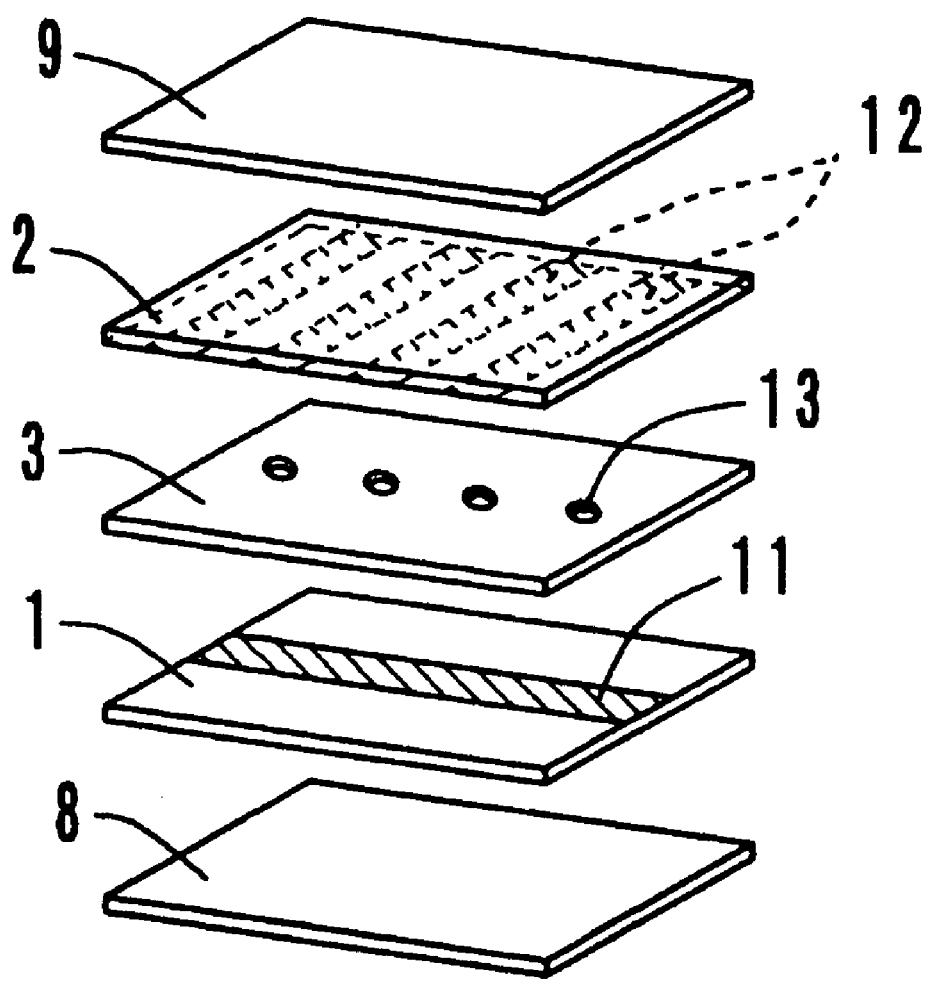
FIG. 7 is an exploded perspective view of sheets defining a laminated compact of a surge absorber array according to the second preferred embodiment of the present invention.

FIG. 6 shows surge absorbers of the first preferred embodiment mounted on a printed board 30. The printed board 30 has an IC 31 mounted thereon, having terminals that are connected with signal lines 32 and signal lines 33. The signal input external electrode layers 22 are connected to the signal lines 32, and the signal output external electrode layers 23 are connected to the signal lines 33. The ground external electrode layers 21 are connected to a ground line 34 on the printed board 30.

The surge absorber of the first preferred embodiment is preferably a three-terminal surge absorber with the external electrode layers 21, 22, and 23, and the ground line 34 extends across the signal lines 32 and 33 on the printed board 30. The wiring of the ground line 34 therefore is simple enough for the surge absorber to be mounted in a small space.

Second Preferred Embodiment

FIGS. 7 through 12 show a surge absorber array according to the second preferred embodiment of the present invention. In the second preferred embodiment, a plurality of discharge elements G are provided in one chip, thus producing an array structure.

The basic structure of the second preferred embodiment is similar to that of the first preferred embodiment. In the second preferred embodiment, however, a plurality of second internal electrode films 12 are provided on the reverse surface of the ceramic green sheet 2, and a plurality of discharge holes 13 are provided in the ceramic green sheet 3 at a location corresponding to the portion where the internal electrode film 11 and the internal electrode films 12 overlap.

Figure 8:
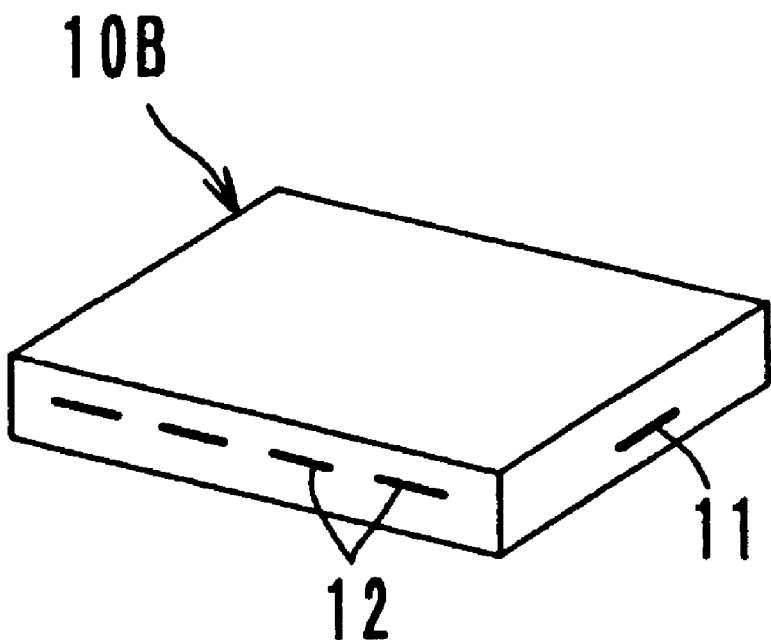
FIG. 8 is a perspective view of a laminated compact of the sheets shown in FIG. 7.
Figure 9:
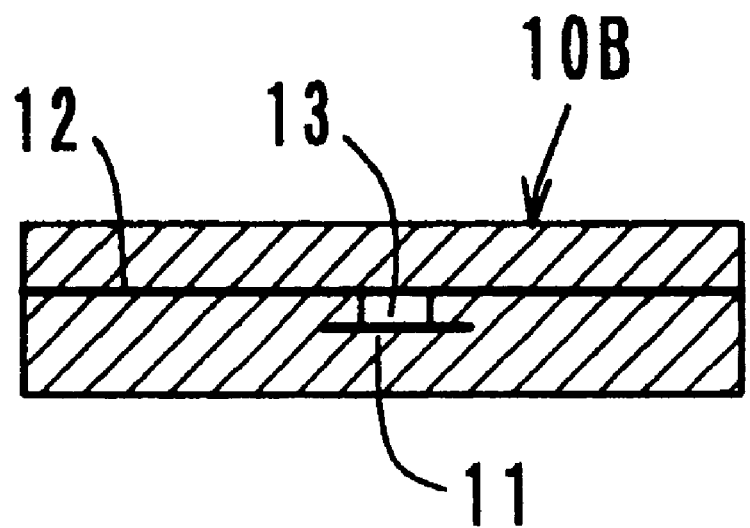
FIG. 9 is a cross-sectional view of the laminated compact of the sheets shown in FIG. 7.
Figure 10:
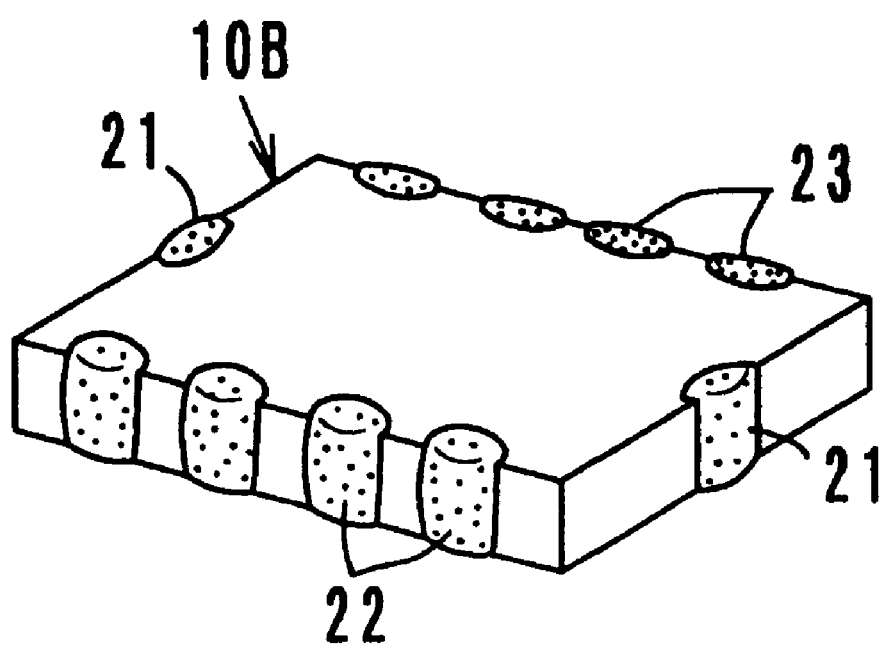
FIG. 10 is a perspective view of external electrode layers provided on the laminated compact shown in FIG. 8.

The sheets 1 through 3, 8, and 9 are laminated and baked to form a single unitary laminated compact 10B shown in FIGS. 8 and 9. As shown in FIG. 10, ground external electrode layers 21 are provided on both end surfaces of the laminated compact 10B so as to be connected with both ends of the first internal electrode film 11. A signal input external electrode layer 22 and a signal output external electrode layer 23 are also provided on both side surfaces of the laminated compact 10B so as to be independently connected with both ends of each of the second internal electrode films 12.

Figure 11:
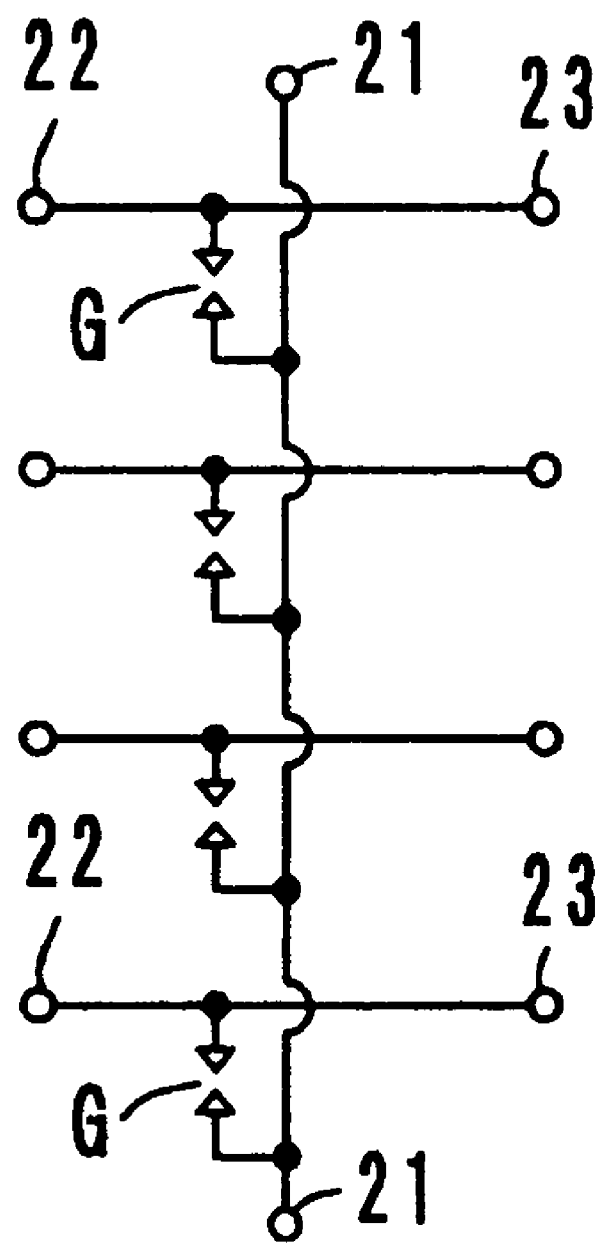
FIG. 11 is an equivalent circuit diagram of the surge absorber array according to the second preferred embodiment of the present invention.
Figure 12:
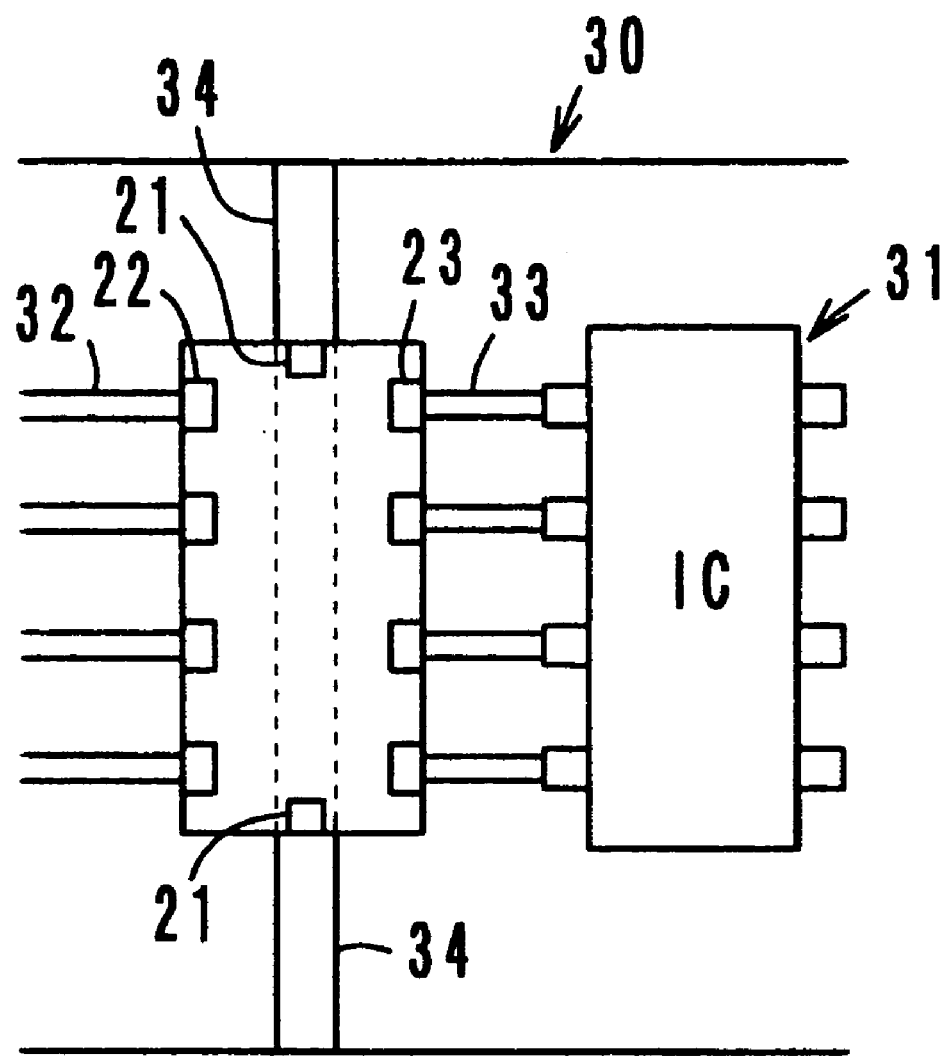
FIG. 12 is a plan view of the surge absorber array according to the second preferred embodiment mounted on a printed board.

FIG. 11 shows an equivalent circuit of a three-terminal surge absorber array in which a plurality of discharge elements G are arranged in the laminated component 10B, and FIG. 12 shows a surge absorber array mounted on a printed board 30. On the printed board 30, the signal input external electrode layers 22 are connected to signal lines 32, and the signal output external electrode layers 23 are connected to signal lines 33. The ground external electrode layers 21 are connected to a ground line 34 in the same manner as in the first preferred embodiment. The second preferred embodiment achieves advantages similar to those of the first preferred embodiment.

In the second preferred embodiment, the second internal electrode films 12 are not necessarily provided on the single sheet 2, and may be provided on a plurality of ceramic green sheets dispersedly, e.g., in a staggered fashion.

Third Preferred Embodiment

Figure 13:
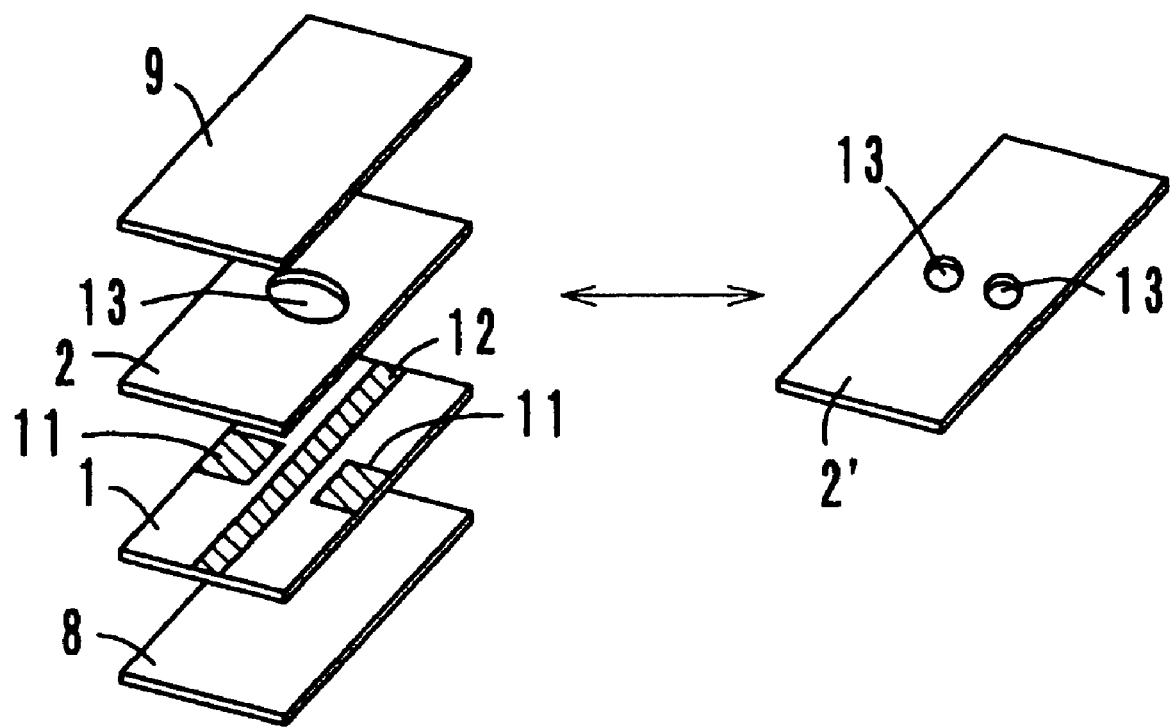
FIG. 13 is an exploded perspective view of sheets defining a laminated compact of a surge absorber array according to a third preferred embodiment of the present invention.
Figure 14:
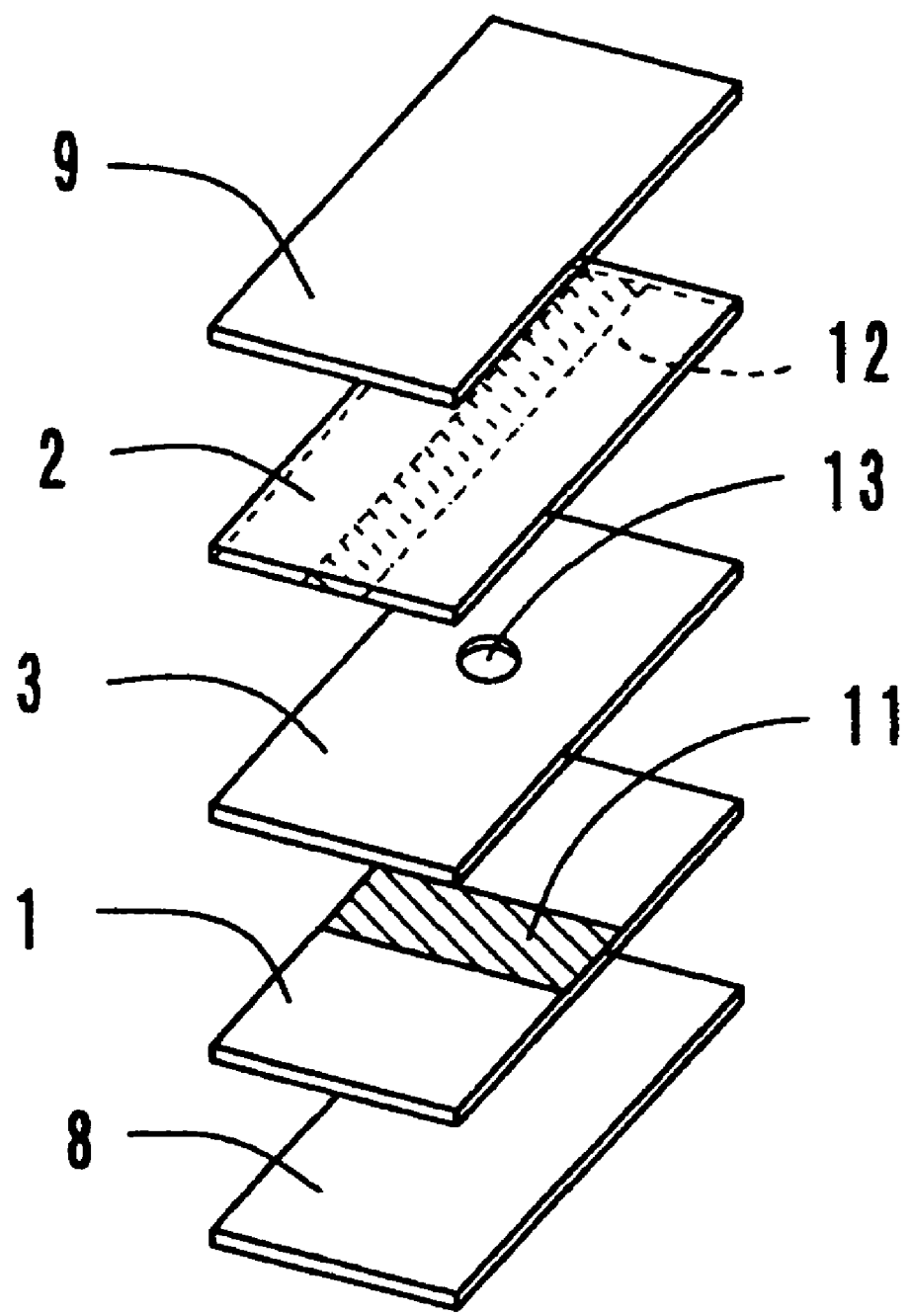
FIG. 14 is an exploded perspective view of sheets defining a laminated compact of a surge absorber according to the fourth preferred embodiment of the present invention.
Figure 15:
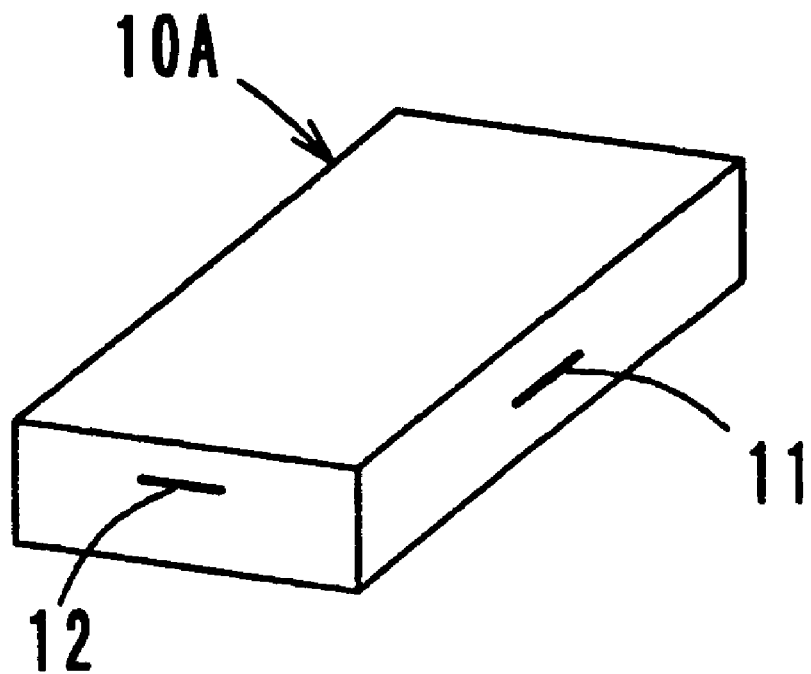
FIG. 15 is a perspective view of a laminated compact of the sheets shown in FIG. 14.
Figure 16:
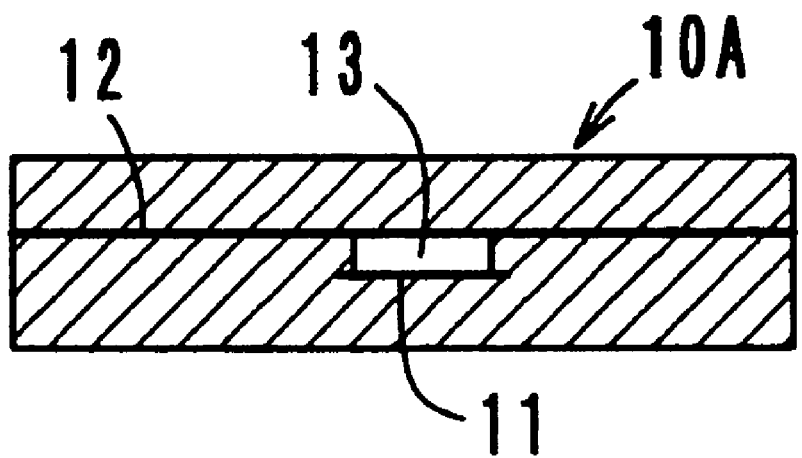
FIG. 16 is a cross-sectional view of the laminate of the sheets shown in FIG. 14.

FIG. 13 shows a surge absorber according to the third preferred embodiment of the present invention. The laminated surge absorber of the third preferred embodiment is a single element, which is similar to that of the first preferred embodiment. In the third preferred embodiment, however, the second internal electrode film 12 is provided on the obverse surface of a single ceramic green sheet 1 so as to extend to both end surfaces thereof, and the first internal electrode films 11 facing each other with the second internal electrode film 12 therebetween are also provided on the obverse surface of the ceramic green sheet 1 so as to extend to both side surfaces thereof.

The ceramic green sheet 2 has a discharge hole 13 located in proximity to the internal electrode films 11 and the internal electrode film 12. The ceramic green sheet 2 may be replaced with a ceramic green sheet 2' having two holes 13.

The sheets 1 and 2 and external plain ceramic green sheets 8 and 9 are laminated and baked to form a single unitary laminate having an appearance that is similar to that of the laminated compact 10A shown in FIG. 4, and having a configuration as an equivalent circuit similar to the circuit shown in FIG. 5. This laminated compact is mounted on a printed board in the manner shown in FIG. 6.

Fourth Preferred Embodiment

FIGS. 14 through 20 show a surge absorber according to the fourth preferred embodiment of the present invention. The surge absorber of the fourth preferred embodiment is configured such that a resistance element R is incorporated in the laminated surge absorber of the first preferred embodiment defining a single element.

Figure 17:
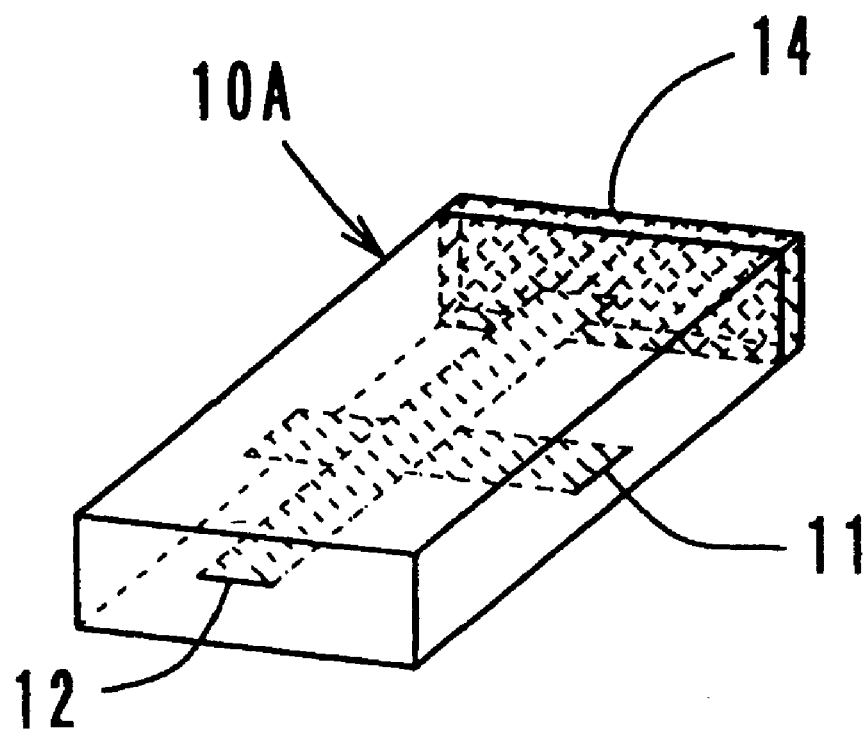
FIG. 17 is a perspective view of a resistor film provided on the laminated compact shown in FIG. 15.
Figure 18:
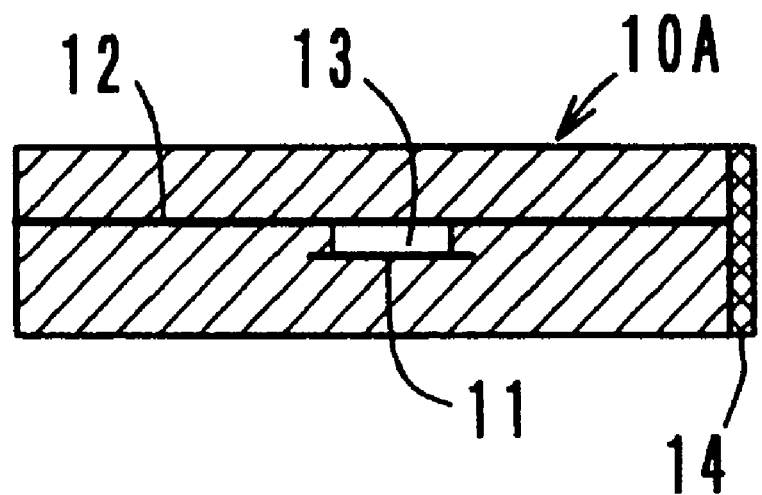
FIG. 18 is a cross-sectional view of the resistor film provided on the laminated compact shown in FIG. 15.

First, a laminated compact 10A having a structure similar to that of the first preferred embodiment is manufactured (see FIGS. 14 through 16), and a resistor film 14 connected with one end of the second internal electrode film 12 is provided on one end surface of the laminated compact 10A in a manner similar to the external electrode layers (see FIGS. 17 and 18). The resistor film 14 is preferably formed by baking a material such as a carbon resistor or a cermet resistor, or by coating resin containing such a resistor material. Alternatively, the resistor film 14 may be formed by affixing a sheet made of such a resistor material.

Figure 19:
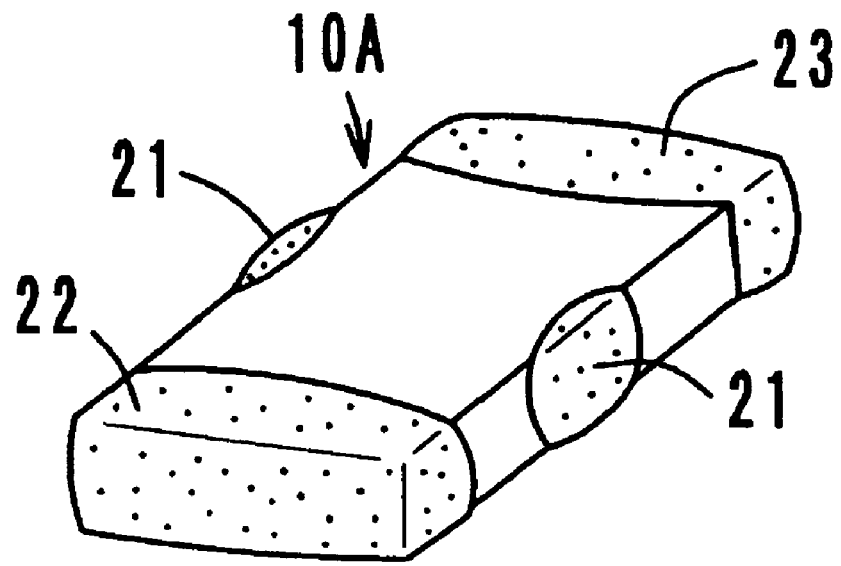
FIG. 19 is a perspective view of external electrode layers provided on the laminated compact shown in FIG. 17.

Then, as shown in FIG. 19, ground external electrode layers 21 are provided on both side surfaces of the laminated compact 10A so as to be connected with both ends of the first internal electrode film 11. A signal input external electrode layer 22 is provided on one end surface of the laminated compact 10A so as to be connected with one end of the second internal electrode film 12, and a signal output external electrode layer 23 is further provided on the other end surface thereof so as to coat the resistor film 14.

Figure 20:
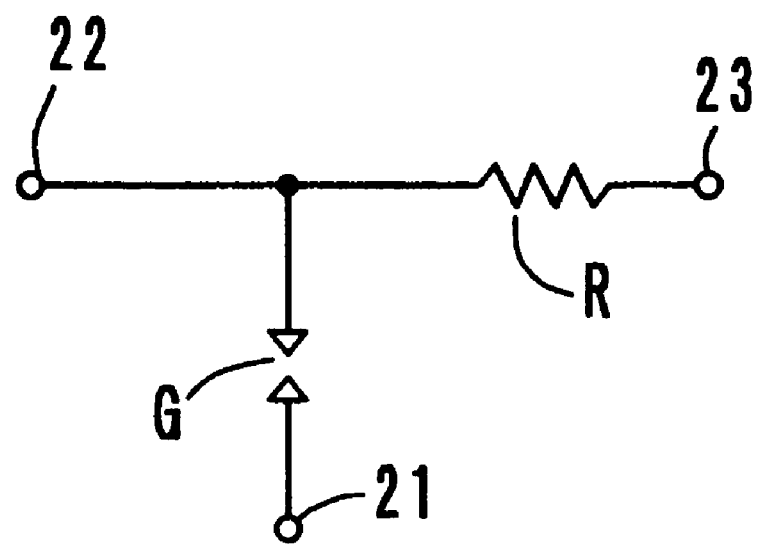
FIG. 20 is an equivalent circuit diagram of the surge absorber according to the fourth preferred embodiment of the present invention.

FIG. 20 shows an equivalent circuit of a three-terminal surge absorber in which the discharge element G and the resistor film 14 (or the resistance element R) are arranged in the laminated compact 10A. This surge absorber is mounted on a printed board 30 in the manner shown in FIG. 6. In addition to the advantages of the first preferred embodiment, the fourth preferred embodiment achieves a further advantage in that complications with separate attachment of resistance elements are eliminated. Moreover, because of its low capacitance, unlike varistors, the surge absorber is suitable for a high-speed signal processing circuit.

In the fourth preferred embodiment, the resistor film 14 is provided on the side corresponding to the signal output external electrode layer 23. However, the resistor film 14 may be provided on the side corresponding to the signal input external electrode layer 22, or may be provided on each of the sides.

Fifth Preferred Embodiment

Figure 22:
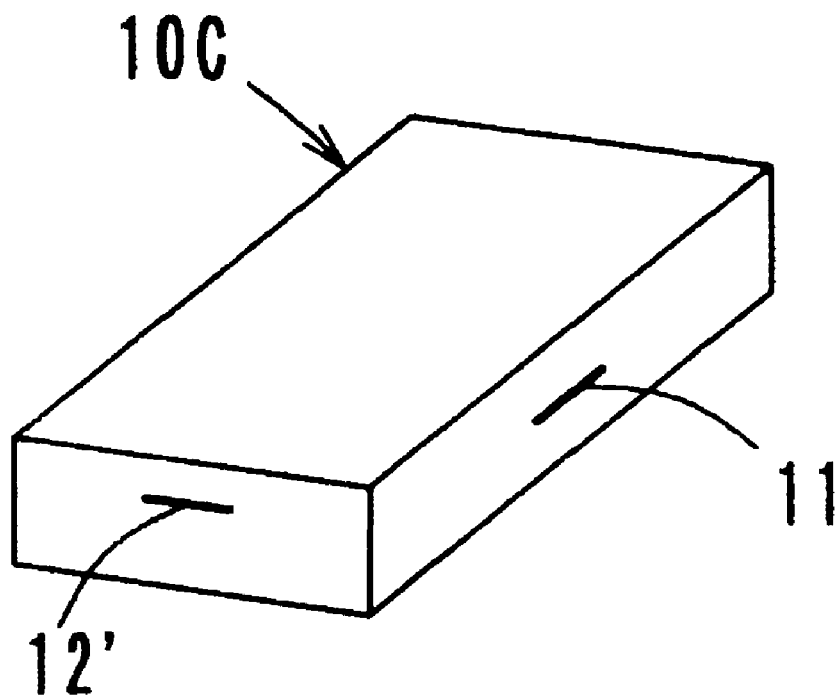
FIG. 22 is a perspective view of a laminated compact of the sheets shown in FIG. 21.
Figure 23:
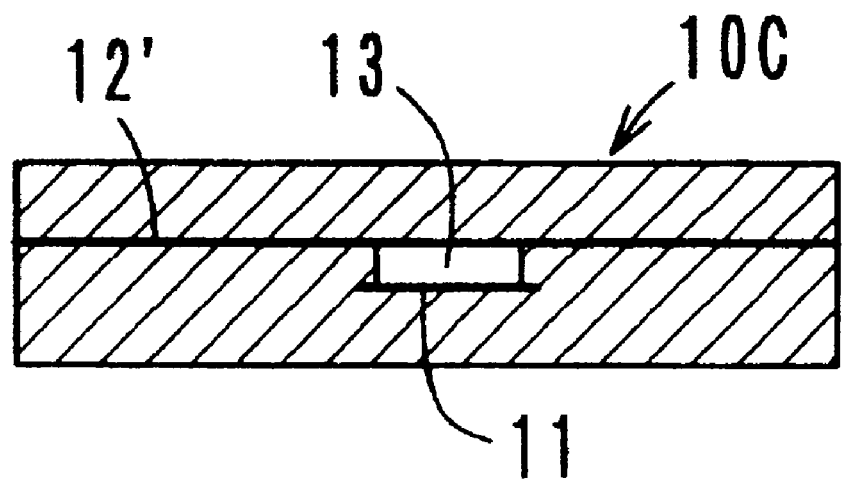
FIG. 23 is a cross-sectional view of the laminated compact of the sheets shown in FIG. 21.
Figure 24:
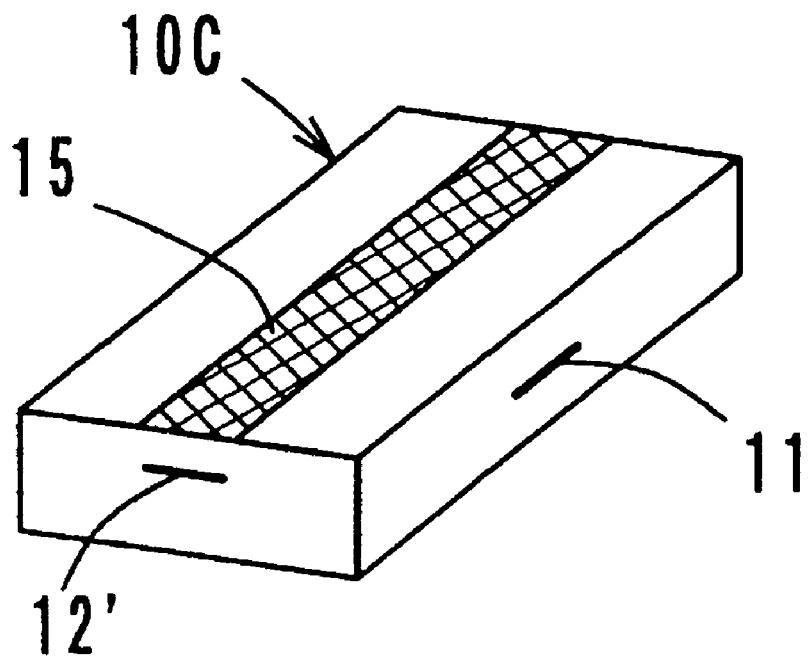
FIG. 24 is a perspective view of a resistor film provided on a surface of the laminated compact shown in FIG. 22.

FIGS. 21 through 26 show a surge absorber according to the fifth preferred embodiment of the present invention. Similar to the surge absorber of the fourth preferred embodiment, the surge absorber of the fifth preferred embodiment is configured such that a resistance element R is incorporated in a laminated surge absorber defining one element. In the fifth preferred embodiment, a resistor film 15 is provided on a surface of a laminated compact 10C, as shown in FIG. 24.

Figure 21:
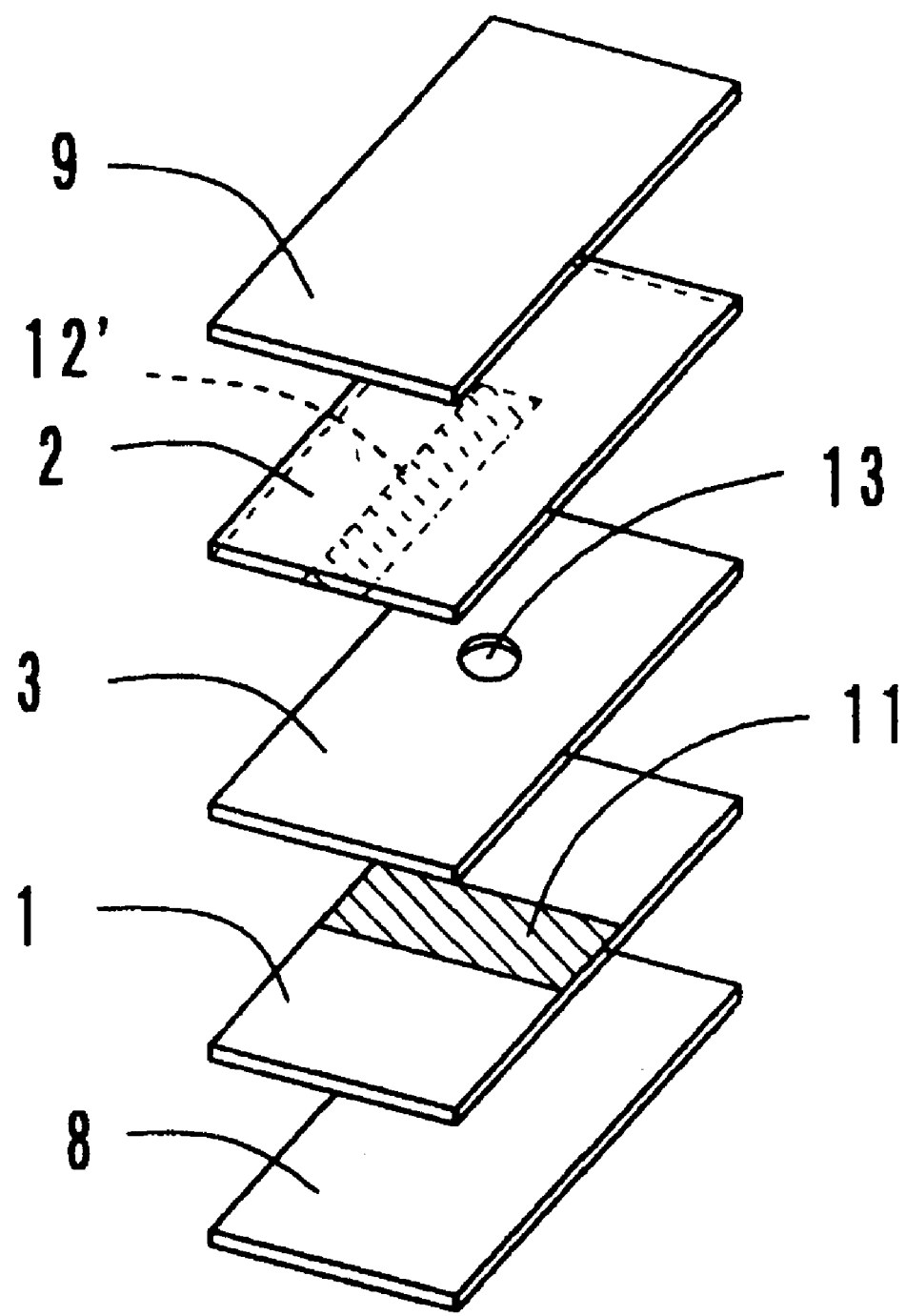
FIG. 21 is an exploded perspective view of sheets defining a laminated compact of a surge absorber according to a fifth preferred embodiment of the present invention.

First, a laminated compact 10C having a structure that is similar to that of the first preferred embodiment is manufactured (see FIGS. 21 through 23). A second internal electrode film 12' provided on the reverse surface of the ceramic green sheet 2 extends from the center of the sheet 2 to only one end surface thereof. The resistor film 15 is applied to the surface of the laminated compact 10C so as to extend to both end surfaces thereof, and is baked (see FIG. 24). The resistor film 15 may be made of the same material as that of the resistor film 14 of the fourth preferred embodiment.

Figure 25:
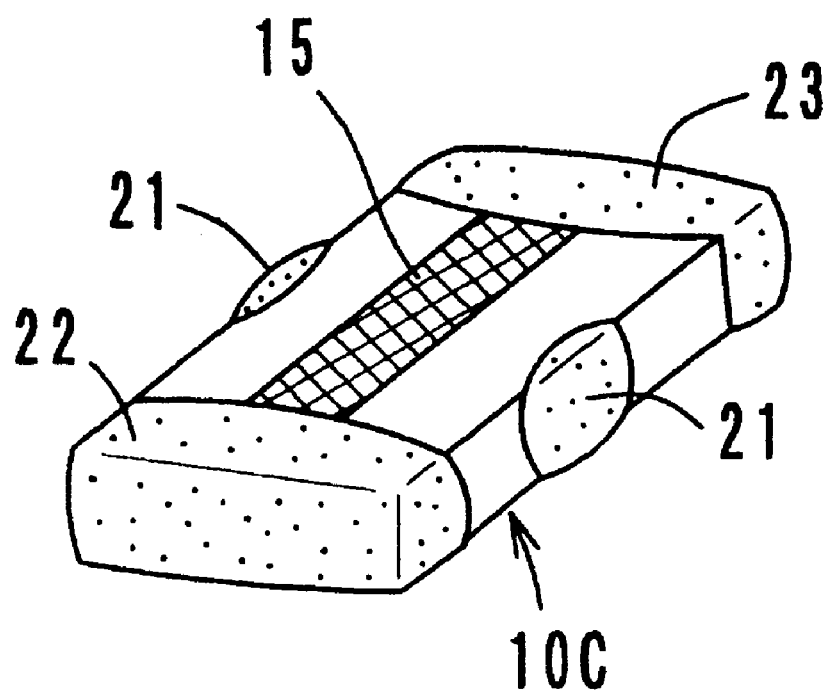
FIG. 25 is a perspective view of external electrode layers provided on the laminated compact shown in FIG. 24.

Then, as shown in FIG. 25, ground external electrode layers 21 are provided on both side surfaces of the laminated compact 10C so as to be connected with both ends of the first internal electrode film 11. A signal input external electrode layer 22 is provided on one end surface of the laminated compact 10C so as to be connected with one end of the second internal electrode film 12' and one end of the resistor film 15, and a signal output external electrode layer 23 is further provided on the other end surface thereof so as to be connected with the other end of the resistor film 15. The resistor film 15 may be provided after the external electrode layers 22 and 23 are formed on the laminated compact 10C.

Figure 26:
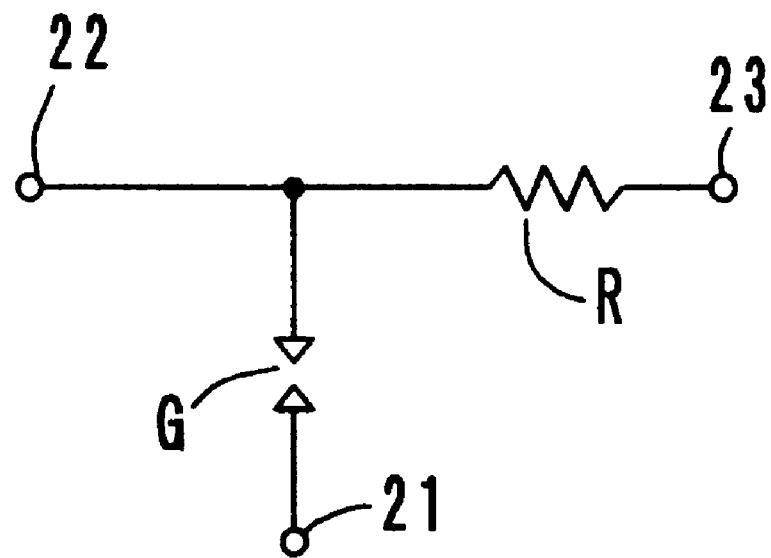
FIG. 26 is an equivalent circuit diagram of the surge absorber according to the fifth preferred embodiment of the present invention.

FIG. 26 shows an equivalent circuit of a three-terminal surge absorber having the discharge element G arranged in the laminated compact 10C and the resistor film 15 (or the resistance element R) provided on the surface of the laminated compact 10C. This surge absorber is mounted on a printed board 30 in the manner shown in FIG. 6. The fifth preferred embodiment achieves advantages that are similar to those of the fourth preferred embodiment.

Sixth Preferred Embodiment

Figure 27:
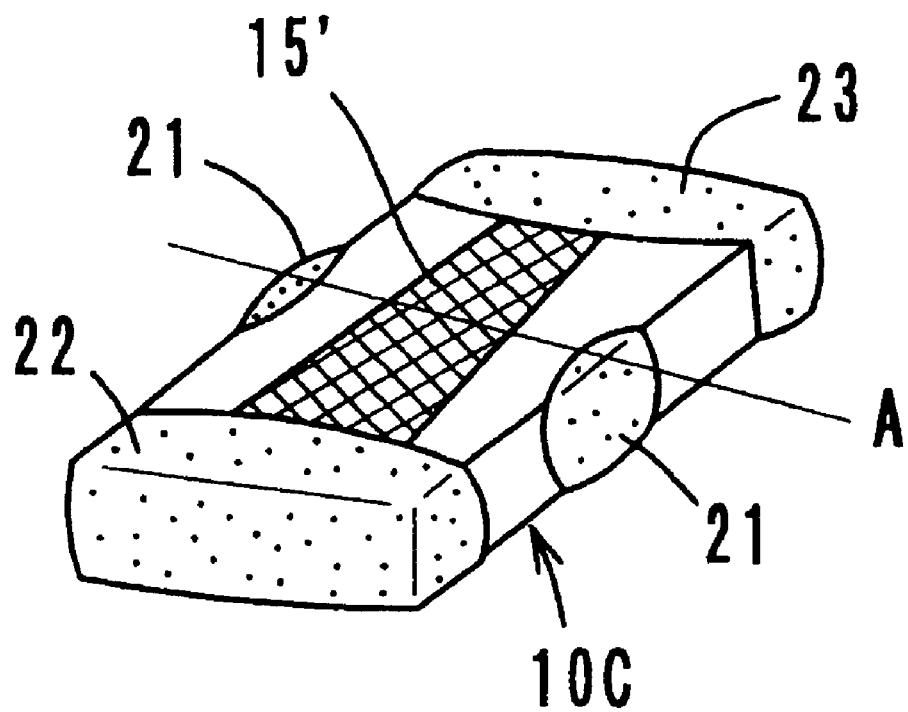
FIG. 27 is a perspective view of a surge absorber according to the sixth preferred embodiment of the present invention.

FIG. 27 shows a surge absorber according to the sixth preferred embodiment of the present invention. The surge absorber of the sixth preferred embodiment is a laminated surge absorber defining one element, which incorporates a resistance element R, as in the fifth preferred embodiment. The surge absorber of the sixth preferred embodiment is different from that of the fifth preferred embodiment in that a resistor film 15' provided on the surface of the laminated compact 10C is asymmetrical in plane view relative to the direction of a line A extending between both side surfaces of the laminated compact 10C.

The resistor film 15' is shaped such that one end thereof is wider than the other end. This enables the signal external electrode layers 22 and 23 to be easily identified in their direction when the surge absorber is mounted on a printed board, thus preventing the surge absorber from being mounted in the wrong direction. Either end of the resistor film 15' may be wider.

Seventh Preferred Embodiment

Figure 28:
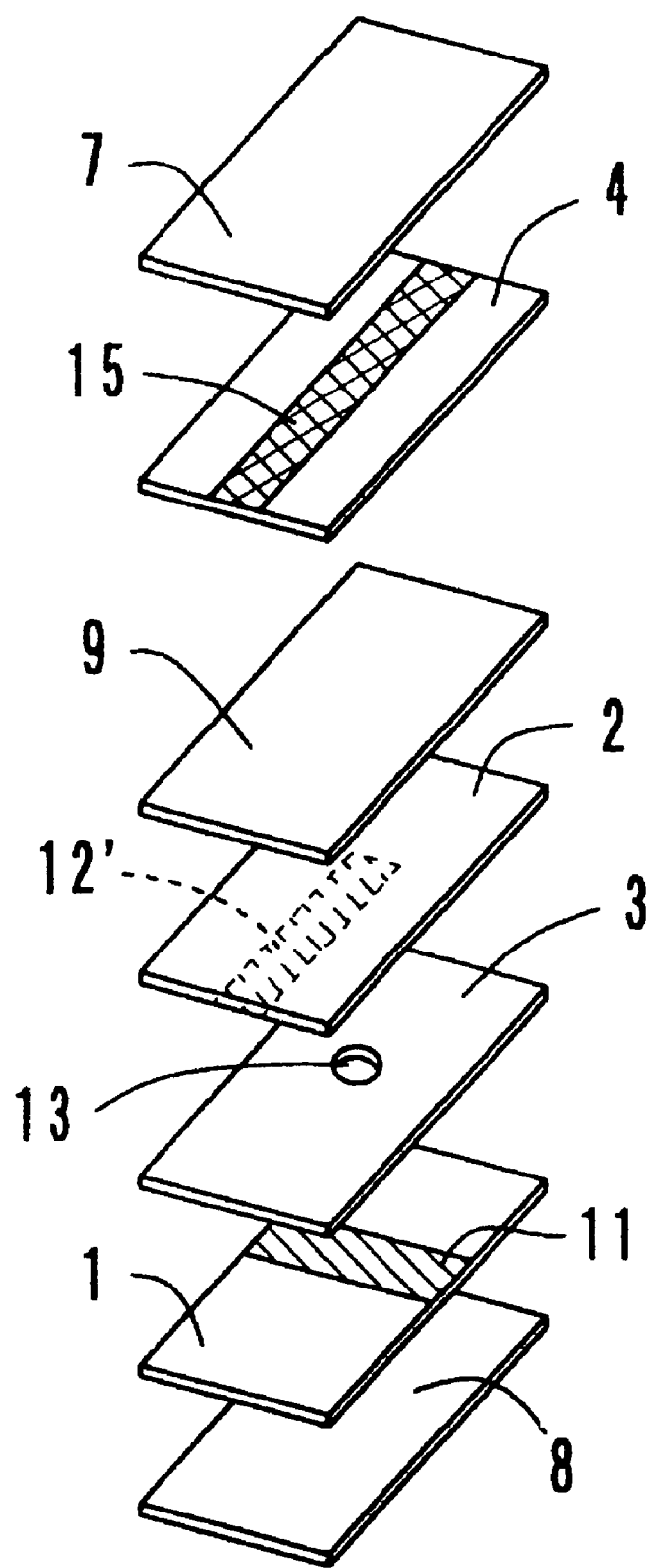
FIG. 28 is an exploded perspective view of sheets defining a laminated compact of a surge absorber according to the seventh preferred embodiment of the present invention.
Figure 29:
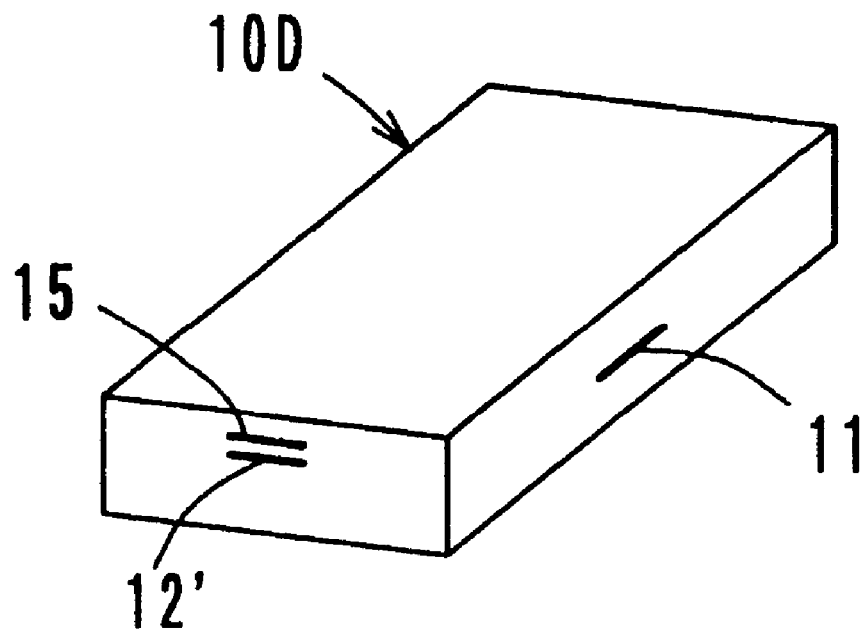
FIG. 29 is a perspective view of a laminated compact of the sheets shown in FIG. 28.
Figure 30:
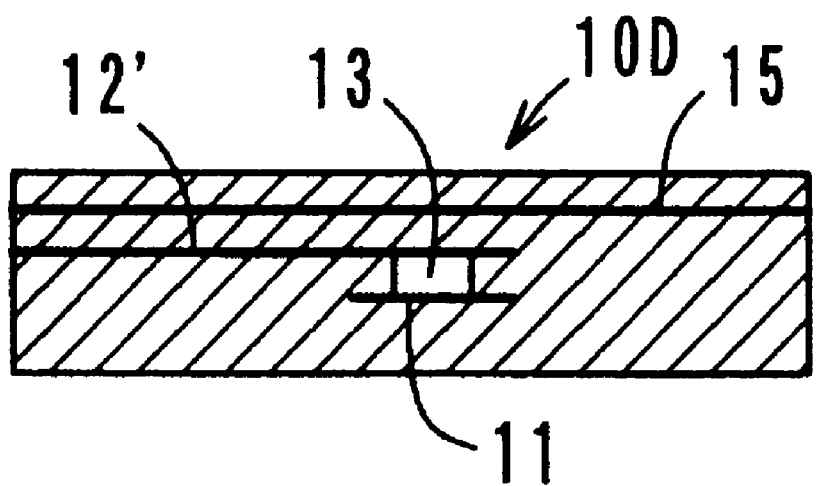
FIG. 30 is a cross-sectional view of the laminated compact of the sheets shown in FIG. 28.

FIGS. 28 through 31 show a surge absorber according to the seventh preferred embodiment of the present invention. Like the surge absorber of the fifth preferred embodiment, the surge absorber of the seventh preferred embodiment is configured such that a resistance element R, which is made of a resistor film 15, is incorporated in a laminated surge absorber defining one element. As shown in FIG. 28, the resistor film 15 is provided on the obverse surface of a ceramic green sheet 4 so as to extend to both end surfaces thereof. The sheet 4 and the other sheets 1 through 3 and 7 through 9 are laminated, compressed, and baked to thereby form a one-unit laminated compact 10D shown in FIG. 29. FIG. 30 shows the cross-section of the laminated compact 10D.

Figure 31:
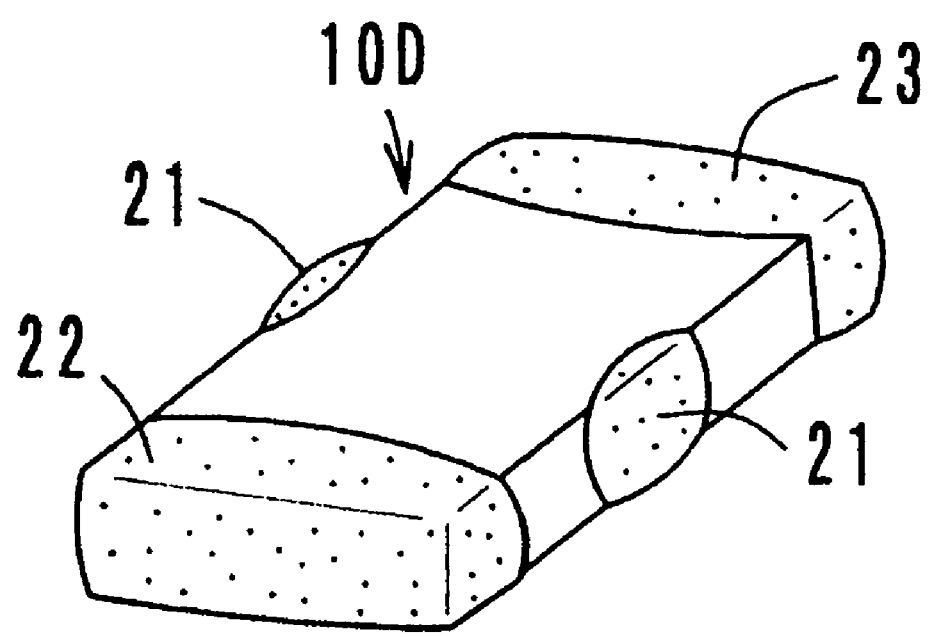
FIG. 31 is a perspective view of external electrode layers provided on the laminated compact shown in FIG. 29.

As shown in FIG. 31, external electrode layers 21, 22, and 23 are provided on the laminated compact 10D, and a surge absorber including the discharge element G and the resistance element R therein is obtained. The equivalent circuit of this surge absorber is similar to that of the sixth preferred embodiment shown in FIG. 26. The seventh preferred embodiment achieves advantages that are similar to those of the sixth preferred embodiment.

Other Preferred Embodiments

The surge absorber and surge absorber array according to the present invention are not limited to the above-described preferred embodiments, and a variety of modifications may be made without departing from the scope of the invention.

For example, the internal electrode films and the hole defining a discharge element may have any shape, and the resistor film defining a resistance element may also have any shape.

In the above-described preferred embodiments, a laminated compact of ceramic green sheets defines an insulator block; however, for example, an insulating material may be molded to form an insulator block. In this case, an internal electrode film may be formed with a metal plate or other suitable structure, rather than the method shown in the above-described preferred embodiments.

In the above-described preferred embodiments, a ground external electrode layer is provided on each of both side surfaces of a laminated compact. However, a ground external electrode layer may be configured in a band shape so as to extend across the four surfaces of the laminated compact, i.e., both side surfaces and the top and bottom surfaces thereof. In the above-described preferred embodiments, the single first internal electrode film and the single second internal electrode film are provided. However, a plurality of first internal electrodes and/or a plurality of second internal electrodes may be connected in parallel.

Although a discharge hole is provided in a single ceramic green sheet, the hole may be provided in a plurality of sheets, or a sheet having a hole provided therein may be thicker than any other sheet (for example, a sheet having internal electrode films provided thereon). While an internal electrode film is provided on the obverse or reverse surface of a ceramic green sheet, the internal electrode film may be embedded in the sheet. Otherwise, the internal electrode film may be exposed at the obverse or reverse surface of the sheet.

In the above-described preferred embodiments, a discharge hole is located in proximity to the first internal electrode film and the second internal electrode film such that the discharge hole is placed therebetween, or is located in proximity above the first internal electrode film and the second internal electrode film. As long as discharge is possible between the first internal electrode film and the second internal electrode film, the hole may be located in proximity to the first and second internal electrode films in any manner. The hole may have any shape or size. For example, the array structure described in the second preferred embodiment may include a hole large enough to cover a plurality of discharge elements.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A surge absorber comprising:
   an insulator block including a first internal electrode film, a second internal electrode film, and a discharge hole;
   ground external electrode layers provided on both opposed side surfaces of the insulator block so as to be connected to both ends of the first internal electrode film; and
   signal external electrode layers provided on both opposed end surfaces of the insulator block so as to be connected to both ends of the second internal electrode film; wherein
   the first internal electrode film extends in a longitudinal direction that is substantially perpendicular to a longitudinal direction in which the second internal electrode film extends such that portions of the first and second internal electrode films overlap; and
   the discharge hole is disposed between the overlapping portions of the first and second internal electrode films.

2. A surge absorber according to claim 1, further comprising a resistor film on at least one end surface of the insulator block, the resistor film being connected between one of the ends of the second internal electrode film and one of the signal external electrode layers.

3. A surge absorber array comprising:
   an insulator block including a first internal electrode film, a plurality of second internal electrode films, and at least one discharge hole;
   ground external electrode layers provided on both opposed end surfaces of the insulator block so as to be connected to both ends of the first internal electrode film; and
   signal external electrode layers provided on both opposed side surfaces of the insulator block so as to be independently connected to both ends of each of the plurality of second internal electrode films; wherein
   the first internal electrode film extends in a longitudinal direction that is perpendicular to a longitudinal direction in which each of the plurality of second internal electrode films extends such that a portion of the first internal electrode film and portions of each of the plurality of second internal electrode films overlap; and
   the at least one discharge hole is disposed between at least one of the overlapping portions of the first and the plurality of second internal electrode films.

4. A surge absorber according to claim 3, further comprising a resistor film on at least one end surface of the insulator block, the resistor film being connected between one of the ends of the second internal electrode film and one of the signal external electrode layers.

5. A surge absorber comprising:
   a laminated compact of a first insulator sheet having a first internal electrode film, a second insulator sheet having a second internal electrode film, and a third insulator sheet between the first and second insulator sheets having a discharge hole;
   ground external electrode layers provided on both opposed side surfaces of the laminated compact so as to be connected to both ends of the first internal electrode film; and signal external electrode layers provided on both opposed end surfaces of the laminated compact so as to be connected to both ends of the second internal electrode film; wherein the first internal electrode film extends in a longitudinal direction that is perpendicular to a longitudinal direction in which the second internal electrode film extends such that portions of the first and second internal electrode films overlap; and the discharge hole is disposed between the overlapping portions of the first and second internal electrode films.

6. A surge absorber according to claim 5, further comprising a resistor film on at least one end surface of the laminated compact, the resistor film being connected between one of the ends of the second internal electrode film and one of the signal external electrode layers.

7. A surge absorber array comprising:

a laminated compact of a first insulator sheet having a first internal electrode film, a second insulator sheet having a plurality of second internal electrode films, and a third insulator sheet between the first and the second insulator sheets having at least one discharge hole;

ground external electrode layers provided on both opposed end surfaces of the laminated compact so as to be connected to both ends of the first internal electrode film; and signal external electrode layers provided on both opposed side surfaces of the laminated compact so as to be independently connected to both ends of each of the plurality of second internal electrode films; wherein the first internal electrode film extends in a longitudinal direction that is perpendicular to a longitudinal direction in which each of the plurality of second internal electrode films extends such that a portion of the first internal electrode film and portions of each of the plurality of second internal electrode films overlap; and the at least one discharge hole is disposed between at least one of the overlapping portions of the first and second internal electrode films.

8. A surge absorber according to claim 7, further comprising a resistor film on at least one end surface of the laminated compact, the resistor film being connected between one of the ends of the second internal electrode film and one of the signal external electrode layers.

9. A surge absorber comprising:

a laminated compact of a first insulator sheet having a second internal electrode film and first internal electrode films on both sides of the second internal electrode film, and a second insulator sheet having a discharge hole located in proximity to the first internal electrode films and the second internal electrode film;

ground external electrode layers provided on both opposed side surfaces of the laminated compact so as to be connected with one end of each of the first internal electrode films; and signal external electrode layers provided on both opposed end surfaces of the laminated compact so as to be connected with both ends of the second internal electrode film; wherein each of the first internal electrode films extends in a longitudinal direction that is perpendicular to a longitudinal direction in which the second internal electrode film extends such that the second internal electrode film is disposed between the first internal electrode films; and the discharge hole is disposed so as to overlap a portion of the first and second internal electrode films.

10. A surge absorber according to claim 9, further comprising a resistor film on at least one end surface of the laminated compact, the resistor film being connected between one of the ends of the second internal electrode film and one of the signal external electrode layers.

11. A surge absorber comprising:

a laminated compact of a first insulator sheet having a first internal electrode film, a second insulator sheet having a second internal electrode film, and a third insulator sheet between the first and the second insulator sheets having a discharge hole;

a resistor film provided on a surface of the laminated compact;

ground external electrode layers provided on both opposed side surfaces of the laminated compact so as to be connected to both ends of the first internal electrode film;

a first signal external electrode layer provided on one end surface of the laminated compact so as to be connected to an end of the second internal electrode film and one end of the resistor film; and a second signal external electrode layer provided on the other opposed end surface of the laminated compact so as to be connected to the other end of the resistor film; wherein the first internal electrode film extends in a longitudinal direction that is perpendicular to a longitudinal direction in which the second internal electrode film extends such that portions of the first and second internal electrode films overlap; and the discharge hole is disposed between the overlapping portions of the first and second internal electrode films.

12. A surge absorber according to claim 11, wherein the resistor film is asymmetrical in plan view with respect to a line extending between both side surfaces of the laminated compact.

13. A surge absorber comprising a laminated compact of a first insulator sheet having a first internal electrode film, a second insulator sheet having a second internal electrode film, a third insulator sheet between the first and second insulator sheets having a discharge hole, and a fourth insulator sheet having a resistor film;

ground external electrode layers provided on both opposed side surfaces of the laminated compact so as to be connected to both ends of the first internal electrode film;

a first signal external electrode layer provided on one end surface of the laminated compact so as to be connected with an end of the second internal electrode film and one end of the resistor film; and a second signal external electrode layer provided on the other opposed end surface of the laminated compact so as to be connected with the other end of the resistor film; wherein the first internal electrode film extends in a longitudinal direction that is perpendicular to a longitudinal direction in which the second internal electrode film extends such that portions of the first and second internal electrode films overlap; and the discharge hole is disposed between the overlapping portions of the first and second internal electrode films.

14. A surge absorber according to claim 13, wherein the resistor film is asymmetrical in plan view with respect to a line extending between both side surfaces of the laminated compact.

* * * * *